United States Patent [19]
Lu

[11] Patent Number: 6,150,847
[45] Date of Patent: Nov. 21, 2000

[54] DEVICE AND METHOD FOR GENERATING A VARIABLE DUTY CYCLE CLOCK

[75] Inventor: Jr-Houng Lu, Keelung, Taiwan

[73] Assignee: Vanguard International Semiconductor Corporation, Hsinchu, Taiwan

[21] Appl. No.: 09/358,013

[22] Filed: Jul. 21, 1999

[30] Foreign Application Priority Data

Mar. 18, 1999 [TW] Taiwan .................................. 88104223

[51] Int. Cl.$^7$ ..................................................... H03K 19/00
[52] U.S. Cl. ............................................................. 326/93
[58] Field of Search ................................ 326/28, 80, 81, 326/93

[56] References Cited

U.S. PATENT DOCUMENTS

| | | | |
|---|---|---|---|
| 5,410,263 | 4/1995 | Waizman | 327/261 |
| 5,506,878 | 4/1996 | Chiang | 327/151 |
| 5,852,370 | 12/1998 | Ko | 326/81 |
| 5,869,978 | 2/1999 | Hong | 326/28 |

Primary Examiner—Trong Phan
Attorney, Agent, or Firm—Darby & Darby

[57] ABSTRACT

A device for generating a variable duty cycle clock is provided, which includes a frequency divider, a plurality of first M-stage delay elements, a plurality of second M-stage delay elements, a selector and a logic gate, where M is an integer. The frequency divider divides an input clock to obtain a divided clock. The first M-stage delay elements, which are connected in series, sequentially delay the divided clock for a first delay time to obtain M first delay clocks. The second M-stage delay elements, which are also connected in series and are corresponding to the first M-stage delay elements, sequentially delay the divided clock for a second delay time to obtain M second delay clocks. The second delay time is in a variable proportion to the first delay time. The selector compares the divided clock and each of the M first delay clocks to obtain M state signals. The M state signals are used to select a first selected clock corresponding to a period of the input clock from the first delay clocks, and a second selected clock corresponding to the first selected clock from the second delay clocks. The logic gate XORs the divided clock and the second selected clock to obtain the variable duty cycle clock.

12 Claims, 8 Drawing Sheets

DEVICE AND METHOD FOR GENERATING A VARIABLE DUTY CYCLE CLOCK

BACKGROUND OF THE INVENTION

1. Field of the Invention

The present invention relates to a circuit device, and in particular, to a device and method to generate a variable duty cycle clock using matched delay lines.

2. Description of the Related Art

Analog PLL (Phase Locked Logic) is the most popular circuit for generating a variable duty cycle clock. However, the PLL circuit transforms all signals (such as timing signals) into voltage signals, so all related analog circuits in the PLL circuit have to be redesigned for different duty cycle clocks and cause a large power loss. In addition, the PLL circuit has a signal feedback effect during signal transformation processes, so a long oscillation time and a long recovery time are also inevitable. In practice, for a high-frequency circuit, the oscillation time and the recovery time of the PLL circuit can be more than 500 clocks, which is an incredibly long time.

SUMMARY OF THE INVENTION

Therefore, it is an object of the present invention to provide a device and method to generate a variable duty cycle clock that uses match delay lines to adjust the duty cycle.

It is another object of the present invention to provide a device and method to generate a variable duty cycle clock that uses digital circuits to lower the power dissipation.

It is another object of the present invention to provide a device and method to generate a variable duty cycle clock that is portable and can be used in different processes.

It is another object of the present invention to provide a device and method to generate a variable duty cycle clock that improves response characteristics by reducing the oscillation/recovery time to less than one clock.

To achieve the above and other objects, the present invention provides a device for generating a variable duty cycle clock, which includes a frequency divider, a plurality of first M-stage delay elements, a plurality of second M-stage delay elements, a selector and a logic gate, where M is an integer. The frequency divider divides an input clock to obtain a divided clock. The first M-stage delay elements, which are connected in series, sequentially delay the divided clock for a first delay time to obtain M first delay clocks. The second M-stage delay elements, which are also connected in series and are corresponding to the first M-stage delay elements, sequentially delay the divided clock for a second delay time to obtain M second delay clocks. The second delay time is in a variable proportion to the first delay time. The selector compares the divided clock and each of the M first delay clocks to obtain M state signals. The M state signals are used to select a first selected clock corresponding to a period of the input clock from the first delay clocks, and a second selected clock corresponding to the first selected clock from the second delay clocks. The logic gate XORs the divided clock and the second selected clock to obtain the variable duty cycle clock.

In this device, the frequency divider can be constructed with a D-type flip flop having a clock terminal (CLK) receiving the input clock, an inverse output terminal (Qn), a data terminal (D) connected to the inverse output terminal (Qn) and an output terminal (Q) outputting the divided clock.

In this device, the first M-stage delay elements can be constructed with a delay line having M first line segments connected in series, each of the first line segments having the first delay time.

In this device, the second M-stage delay elements can be constructed with a delay line having M second line segments connected in series, each of the second line segments having the second delay time.

In this device, the selector can be constructed with AND gates, latches, XOR gates and switches. The AND gates respectively AND the divided clock and each of the M first delay clocks to obtain M shrunk clocks. The latches latch the M shrunk clocks to obtain M latch signals. The XOR gates respectively XOR adjacent latch signals to obtain the M state signals corresponding to the second M-stage delay elements. The switches correspond to the second M-stage delay elements, and select the second selected clock according to the M state signals. In addition, the switches can be constructed with M transmission gates each having a control terminal connected to one of the M state signals.

Further, the present invention also provides a method for generating a variable duty cycle clock. First, an input clock is provided and its frequency divided to obtain a divided clock. Then the divided clock is sequentially delayed for a first delay time to obtain M-stage first delay clocks and M-stage second delay clocks, where M is an integer. The second delay time is in a variable proportion to the first delay time. Then the divided clock and each of the M delay clocks are compared to obtain M state signals for selecting a first selected clock corresponding to a period of the input clock from the M-stage first delay clocks, and a second selected clock corresponding to the first selected clock from the M-stage second delay clocks. Then the variable duty cycle clock can be generated by XORing the divided clock and the second selected clock.

In this method, the divided clock can be generated by a D-type flip flop which has a clock terminal (CLK) receiving the input clock, an inverse output terminal (Qn), a data terminal (D) connected to the inverse output terminal (Qn) and an output terminal (Q) outputting the divided clock.

In this method, the M first delay clocks are generated by a delay line having a plurality of first line segments connected in series, each of the first line segments having the first delay time.

In this method, the second delay clocks are generated by a delay line having a plurality of second line segments connected in series, each of the second line segments having the second delay time.

In this method, the generating step of the state signals includes: first, the divided clock and each of the M first delay clocks are ADDed to obtain M shrunk clocks, which are latched to obtain M latch signals; then adjacent latch signals are respectively XORed to obtain the M state signals.

In this method, the second selected clock is selected by a plurality of switches corresponding to the second delay clocks, and each of the switches has a control terminal connected to one of the state signals, respectively.

BRIEF DESCRIPTION OF THE DRAWINGS

Further objects, features and advantages of the present invention will become apparent from the following detailed description of a preferred embodiment of the invention with reference to the accompanying drawings.

DETAILED DESCRIPTION OF THE INVENTION

Figure 1:
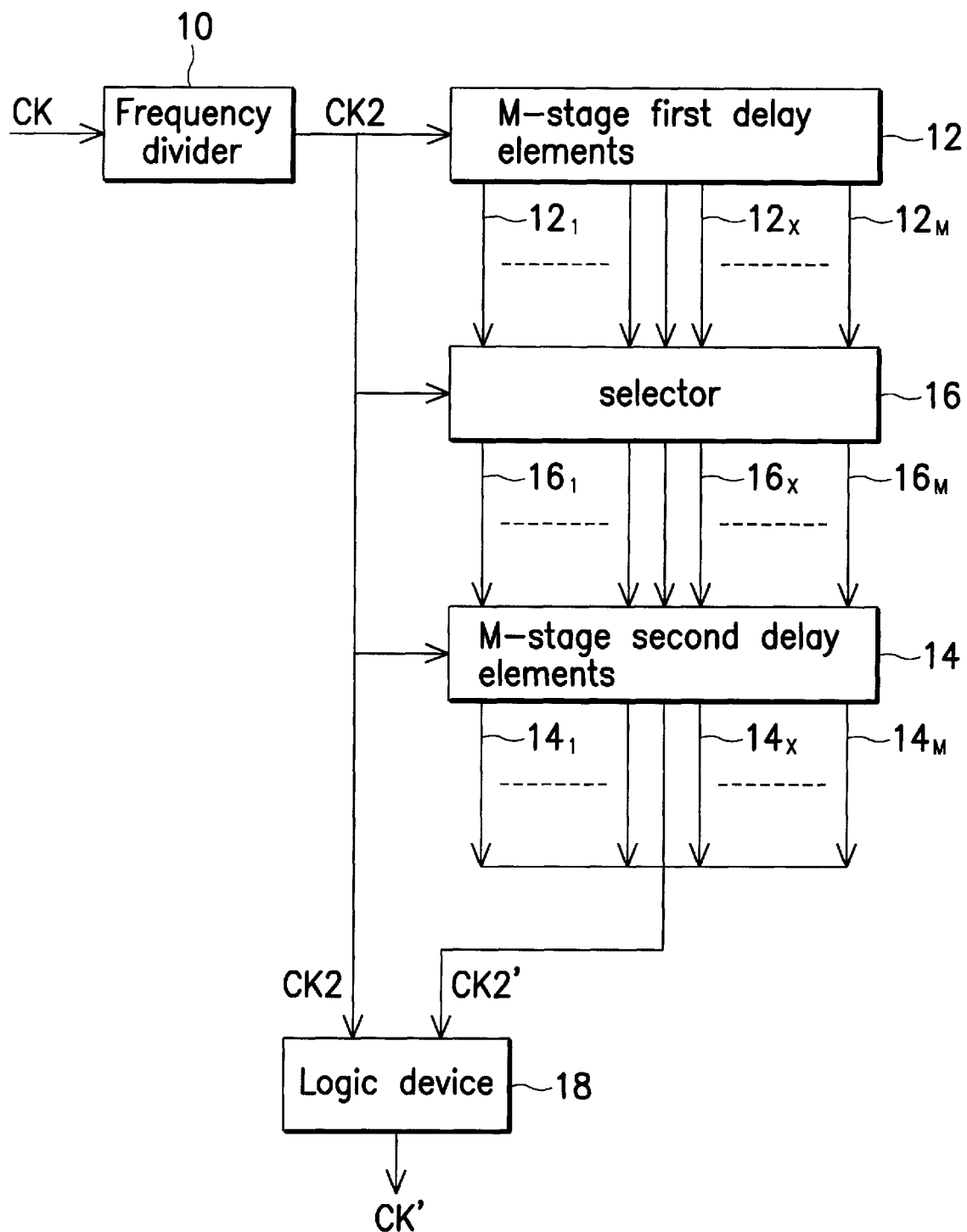
FIG. 1 is a block diagram illustrating a device for generating a variable duty cycle clock according to the present invention.
Figure 2A:
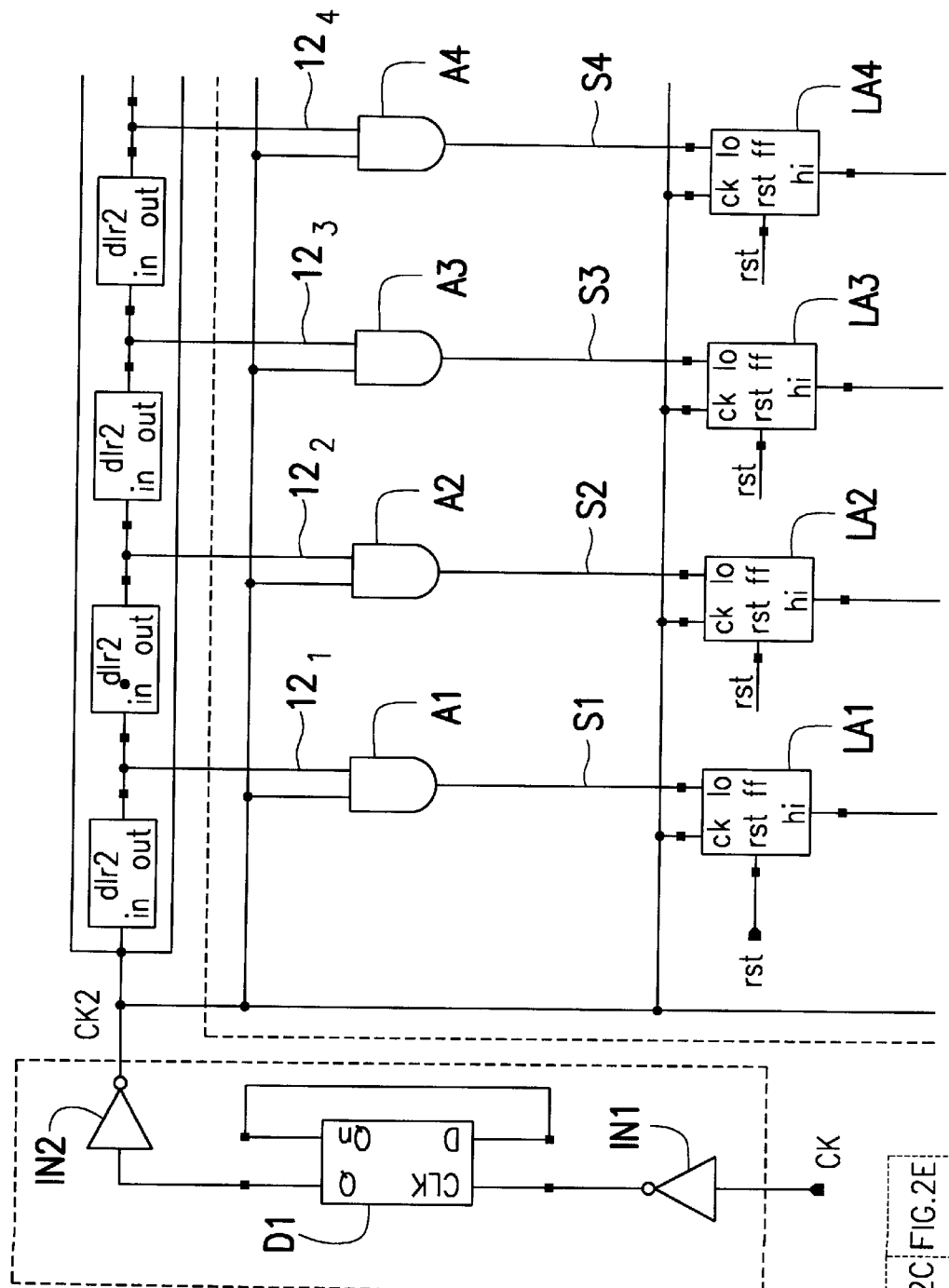
FIGS. 2A through 2F are circuit diagrams illustrating a device for generating a variable duty cycle clock according to the present invention.
Figure 2B:
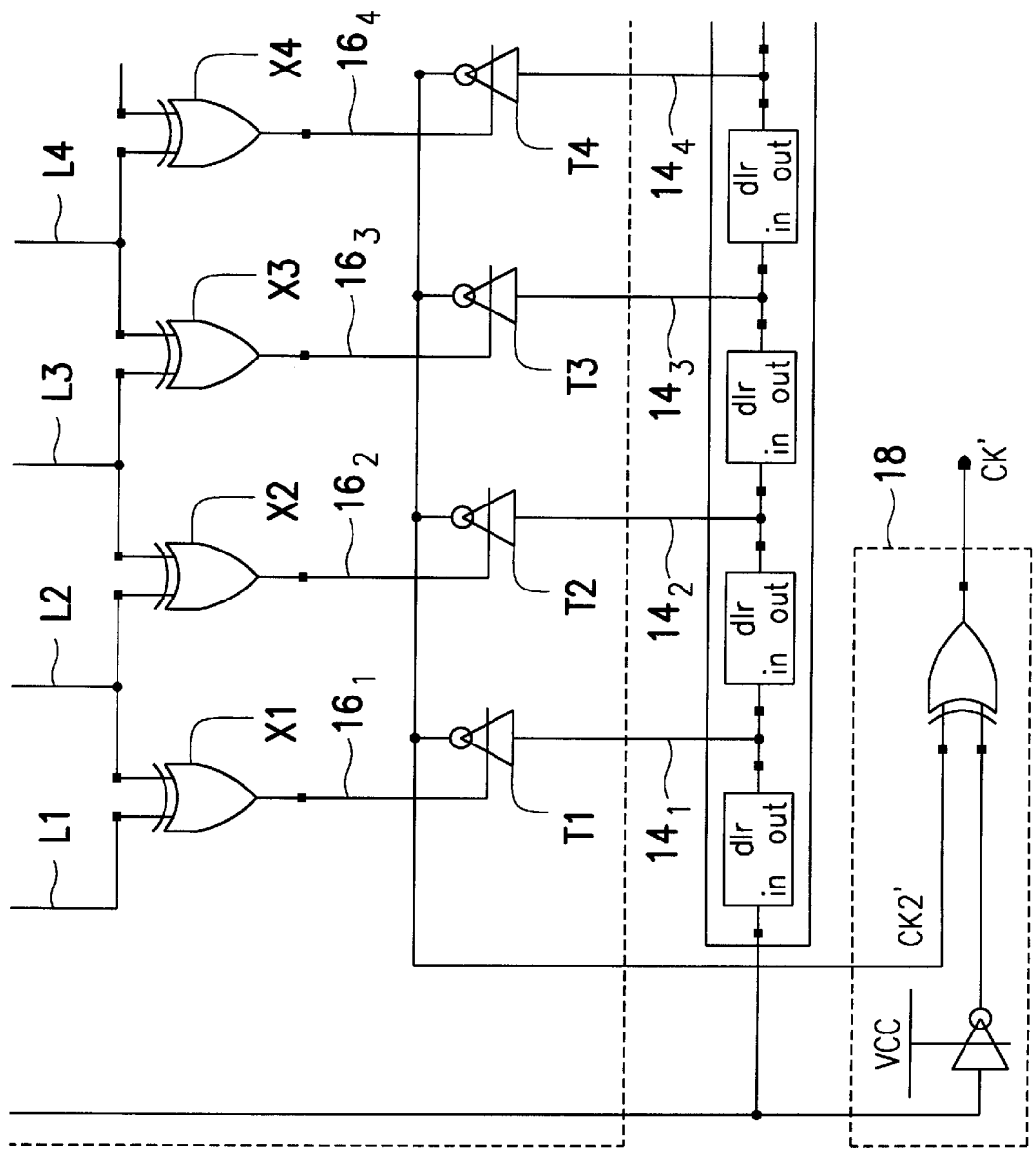
Figure 2C:
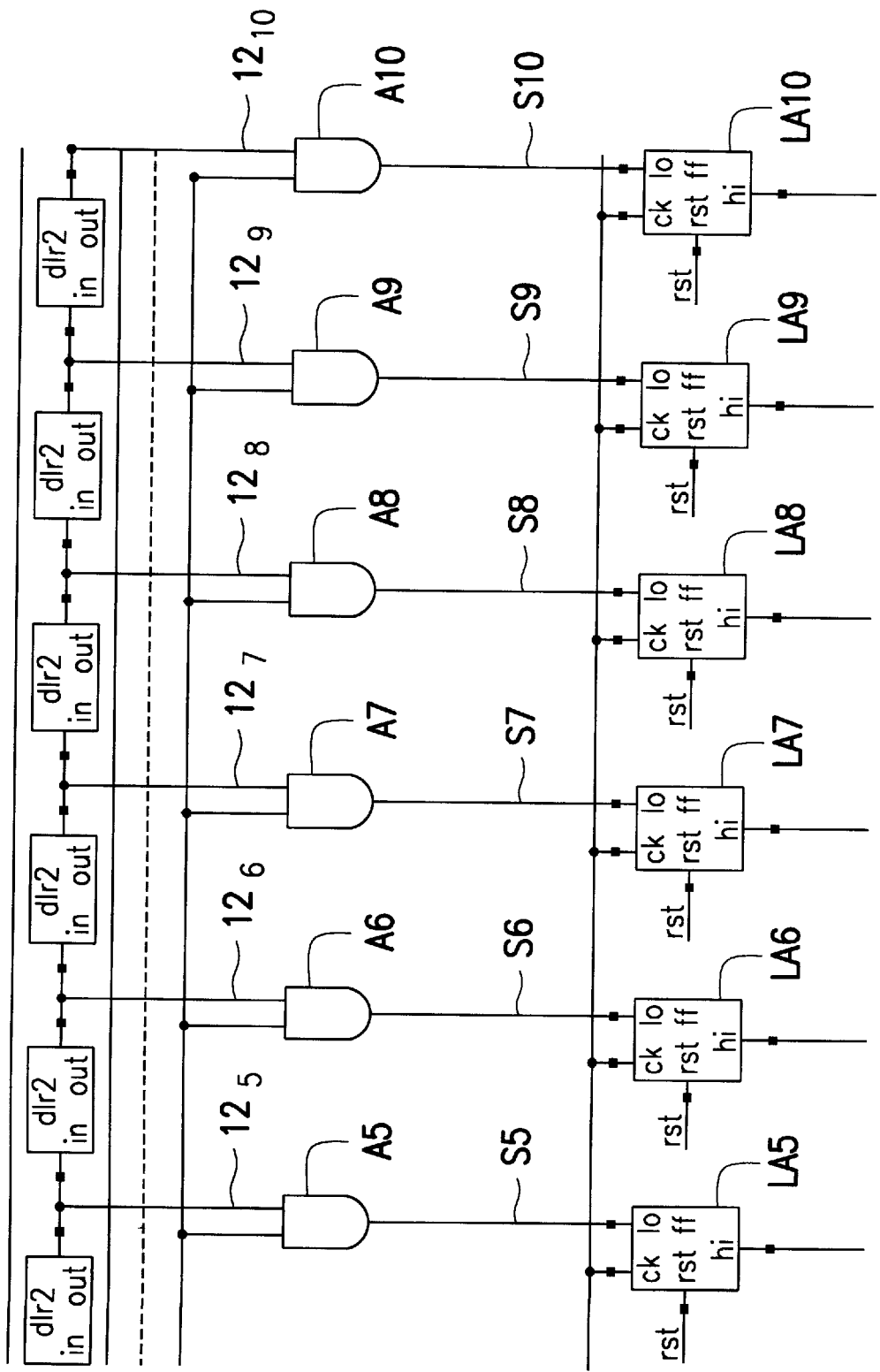
Figure 2D:
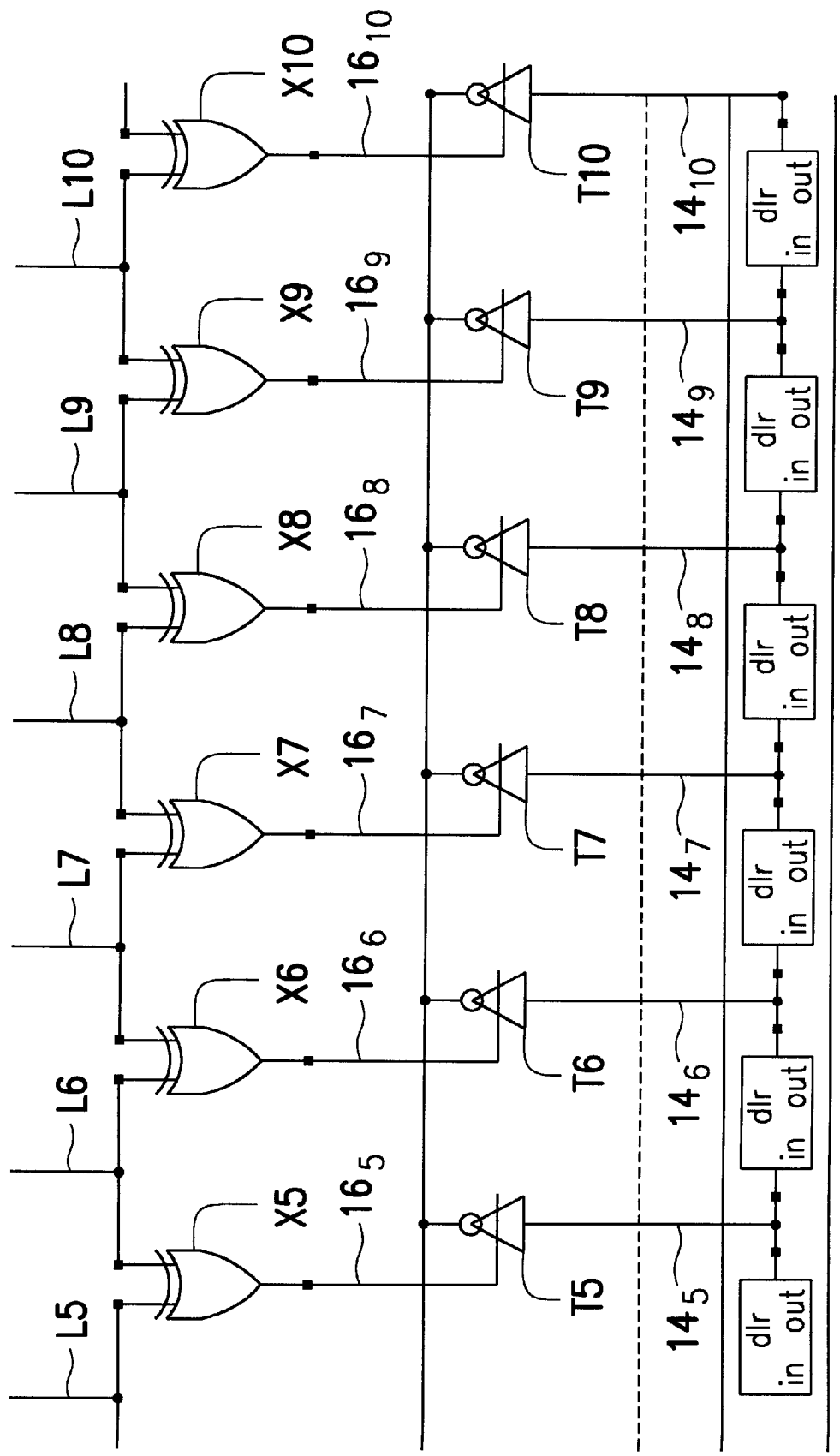
Figure 2E:
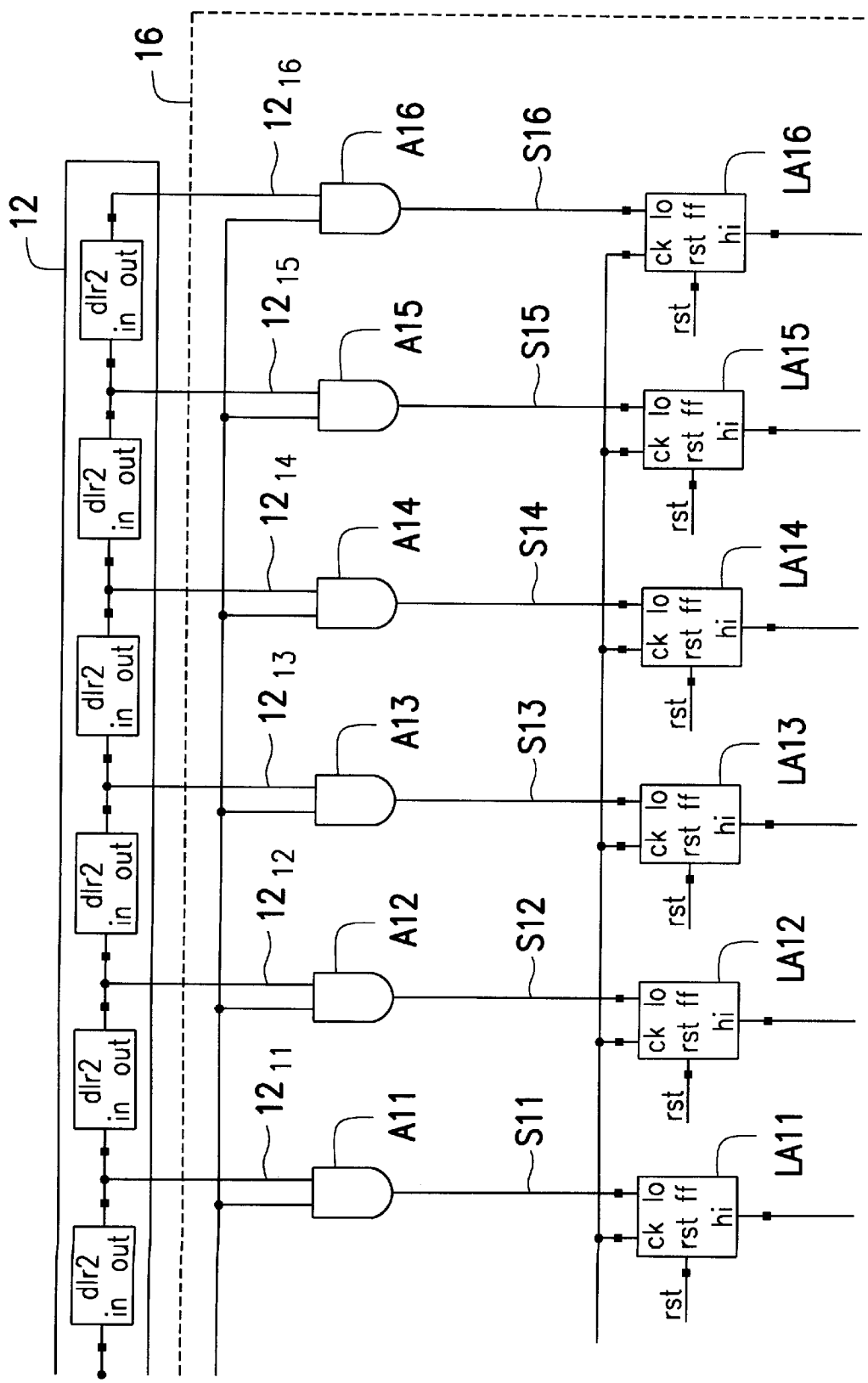
Figure 2F:
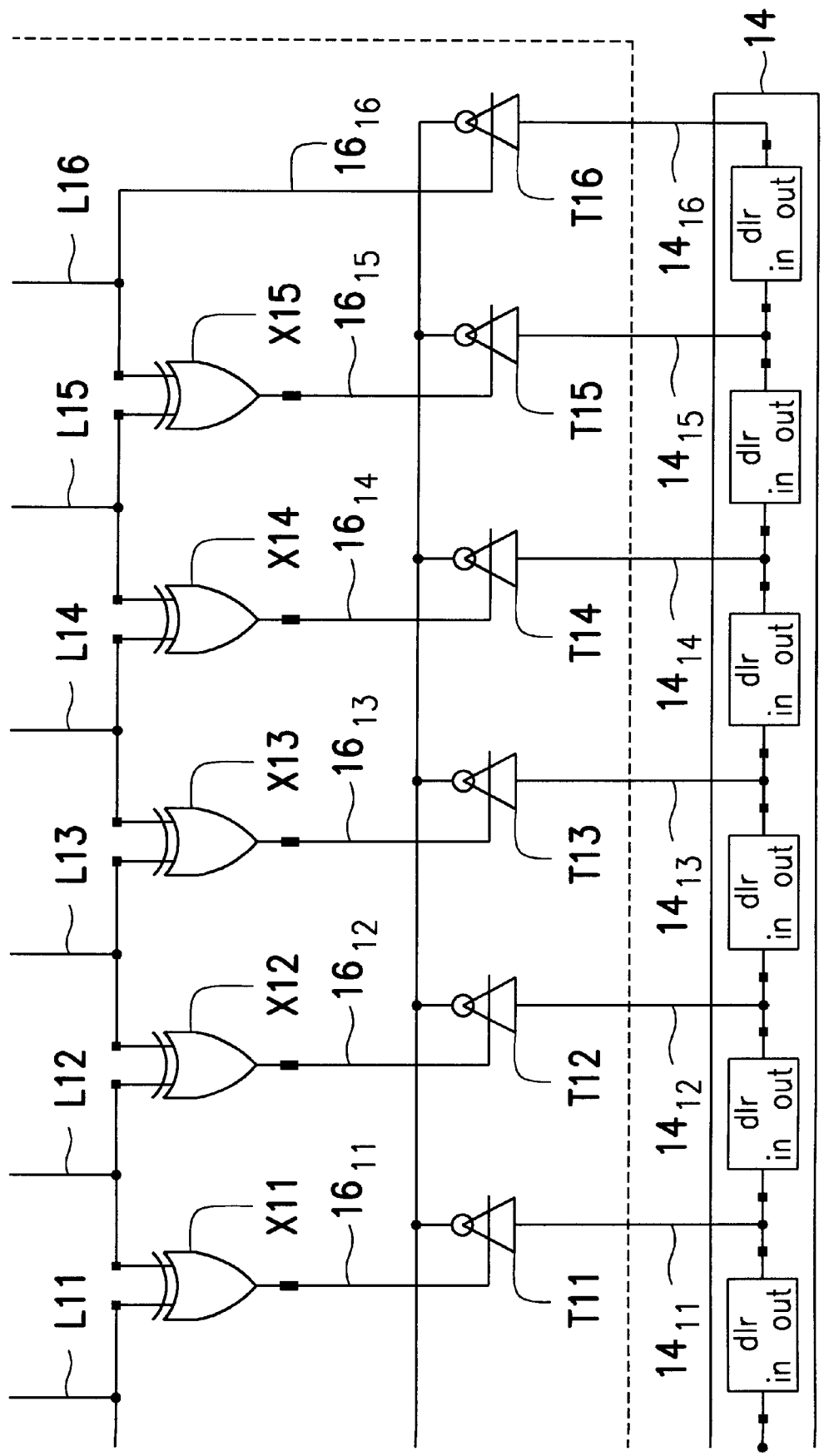
Figure 3:
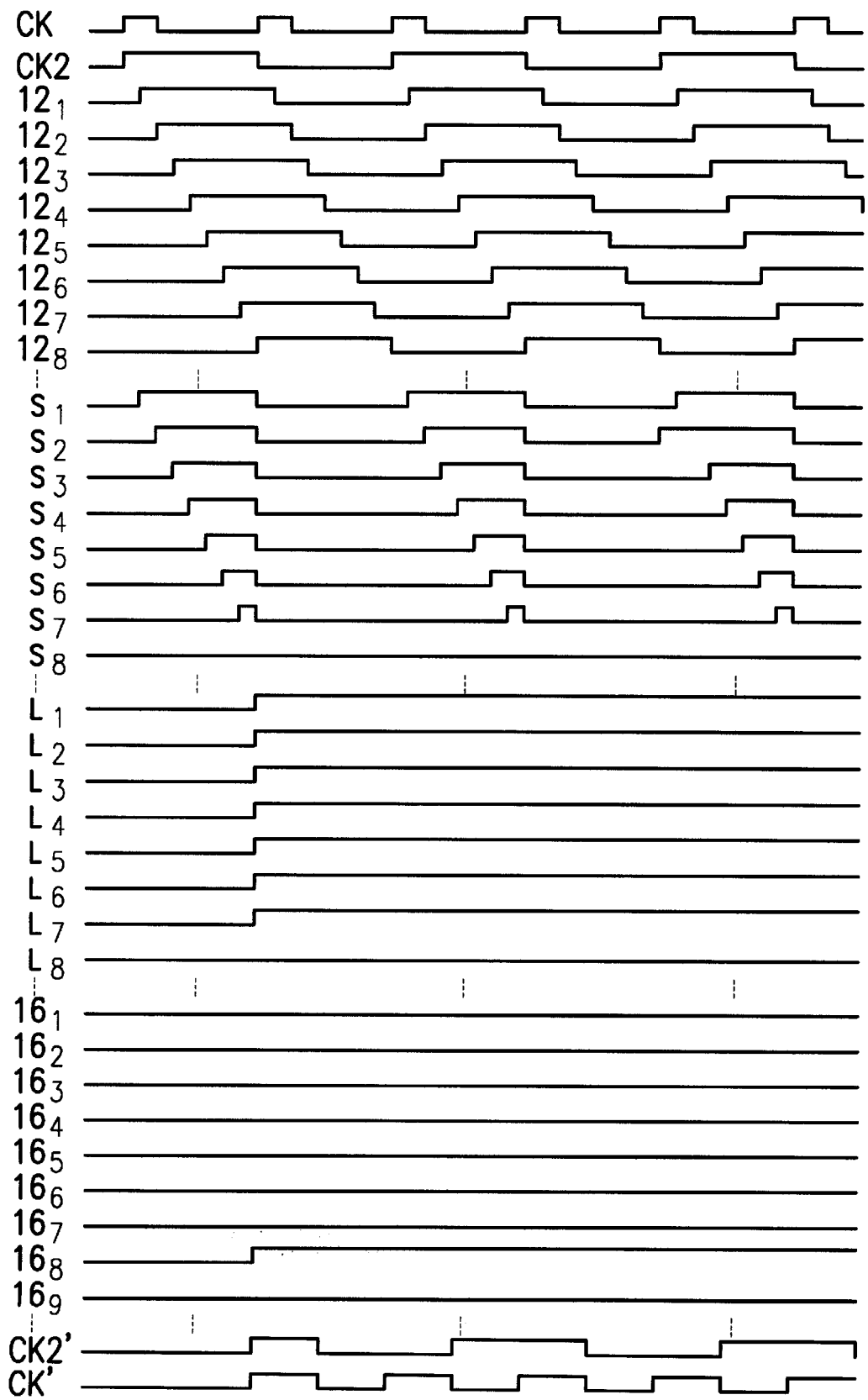
FIG. 3 is a timing diagram showing all nodes of the device for generating a variable duty cycle clock as shown in FIG. 1 and FIG. 2.

FIG. 1 is a block diagram illustrating a device for generating a variable duty cycle clock of the present invention, and FIG. 3 is a timing diagram illustrating all nodes of the device for generating a variable duty cycle clock as shown in FIG. 1.

In FIG. 1, the device for generating a variable duty cycle clock includes a frequency divider 10, M-stage first delay elements 12, M-stage second delay elements 14, a selector 16 and a logic circuit 18.

The frequency divider 10 receives an input clock CK and divided the input clock CK (by 2 in this case) to obtain a divided clock CK2. Therefore, the pulse width of the divided clock CK2 is just the period of the input clock CK.

M-stage first delay elements 12 sequentially delay the divided clock CK2 for a first delay time t to obtain M first delay clocks $12_1 \sim 12_M$. In this case, the clock $12_1$ is obtained by delaying the divided clock CK2 for a first delay time t, the clock $12_2$ is obtained by delaying the clock $12_1$ for a first delay time t (or by delaying the divided clock CK2 for two first delay times 2t), the clock $12_3$ is obtained by delaying the clock $12_2$ for a first delay time t (or by delaying the divided clock CK2 for three first delay times 3t), the clock $12_4$ is obtained by delaying the clock $12_3$ for a first delay time t (or by delaying the divided clock CK2 for four first delay times 4t), and so on.

M-stage second delay elements 14 sequentially delay the divided clock CK2 for a second delay time αt to obtain M second delay clocks $14_1 \sim 14_M$. In this case, α is a predetermined ratio (such as 1/2) which is used to define the duty cycle of the output clock, and the M second delay clocks $14_1 \sim 14_M$ correspond to the M first delay clocks $12_1 \sim 12_M$ respectively. The clock $14_1$ is obtained by delaying the divided clock CK2 for a second delay time αt, the clock $14_2$ is obtained by delaying the clock $14_1$ for a second delay time αt (or by delaying the divided clock CK2 for two second delay times 2αt), the clock $14_3$ is obtained by delaying the clock $14_2$ for a second delay time αt (or by delaying the divided clock CK2 for three second delay times 3αt), the clock $14_4$ is obtained by delaying the clock $14_3$ for a second delay time t (or by delaying the divided clock CK2 for four second delay times 4αt), and so on.

The selector 16 ANDs the divided clock CK2 and each of the M first delay clocks $12_1 \sim 12_M$, respectively, to obtain M shrunk clock $S_1 \sim S_M$. In this case, the M shrunk clock $S_1 \sim S_M$ correspond to the M first delay clocks $12_1 \sim 12_M$, respectively, indicating the AND of the divided clock CK2 and each of the M first delay clocks $12_1 \sim 12_M$. That is to say, once a shrunk clock $S_x$ (say $S_8$) becomes all 0's, the first delay clock $12_x$ (say $12_8$) corresponding to the shrunk clock $S_x$ will be exactly the inverse of the divided clock CK2, and the delay time of the first delay clock $12_x$ will be exactly the period of the input clock CK (or a half of the period of the divided clock CK2). Therefore, once the ratio α of the second delay time αt to the first delay time t is set to a predetermined value (say 1/2), the second delay clock $14_x$ (say $14_8$) corresponding to the first delay clock $12_x$ will delay for the predetermined ratio of the delay time of the first delay clock $12_x$, which is exactly the period of the input clock CK, to obtain a selected delay clock CK2'. In order to obtain the selected delay clock CK2', the selector 16 generates M control signals $16_1 \sim 16_M$ according to the M shrunk clocks $S_1 \sim S_M$ to control the M-stage second delay elements 14. Among the M control clocks $S_1 \sim S_M$, the control clock $S_x$ corresponding to the first delay clock $12_x$ is the only one that is all 1's to select the corresponding second delay clock $14_x$, and all the other control clocks $S_1 \sim S_{x-1}, S_{x+1} \sim S_M$ are all 0's.

The logic circuit 18 XORs the divided clock CK2 and the selected delay clock CK2' to output a clock CK' having a duty cycle of the predetermined ratio α.

FIGS. 2A through 2F are circuit diagrams illustrating a device for generating a variable duty cycle clock, and FIG. 3 is a timing diagram illustrating all nodes of the device for generating a variable duty cycle clock in FIG. 2. For convenience, the M-stage first delay elements 12 are designed as 16-stage first delay elements, the M-stage second delay elements 14 are designed as 16-stage second delay elements, and the duty ratio α of the input clock CK is adjusted to 1/2.

In FIGS. 2A through 2F as in FIG. 1, the device for generating a variable duty ratio clock includes a frequency divider 10, 16-stage first delay elements 12, 16-stage second delay elements 14, a selector 16 and a logic circuit 18.

The frequency divider 10 divides the input clock CK by two to obtain a divided clock CK2. In this case, the frequency divider 10 is constructed with a D-type flip flop which has a clock terminal (CLK) receiving the input clock CK inverted by an inverter IN1, a data terminal (D), an inverse output terminal (Qn) connected to the data terminal (D) and an output terminal (Q) generating the divided clock CK2.

The 16-stage first delay elements 12 sequentially delay the divided clock CK2 for a first delay time t to obtain sixteen first delay clocks $12_1 \sim 12_{16}$, and the 16-stage second delay elements 14 sequentially delay the divided clock CK2 for a second delay time αt to obtain sixteen second delay clocks $14_1 \sim 14_{16}$. In this case, the 16-stage first delay elements 12 are constructed with a delay line having sixteen first line segments connected in series, and each of the first line segments has the first delay time t. The 16-stage second delay elements 14 are constructed with a delay line having sixteen second line segments connected in series, and each of the second line segments has the second delay time αt. The sixteen first line segments sequentially delay the divided clock CK2 for the first delay time t to obtain the sixteen first delay clocks $12_1 \sim 12_{16}$. The sixteen second line segments sequentially delay the divided clock CK2 for the second delay time t to obtain the sixteen second delay clocks $14_1 \sim 14_{16}$. In order to adjust the duty cycle of the input clock CK to 1/2, the ratio α of the second delay time αt to the first delay time t is set to 1/2. Therefore, the sixteen second delay clocks $14_1 \sim 14_{16}$ have delay times half of those the sixteen first delay elements $12_1 \sim 12_{16}$, respectively.

The selector 16 determines the period of the input clock CK according to the divided clock CK2 and the sixteen first delay clocks $12_1 \sim 12_{16}$. In this case, the selector 16 is constructed with sixteen AND gates A1~A16, sixteen latch LA1~LA16, fifteen XOR gates X1~X15 and sixteen switches T1~T16.

The sixteen AND gates A1~A16 respectively AND the divided clock CK2 and each of the sixteen first delay clocks $12_1 \sim 12_{16}$ to obtain sixteen shrunk clocks $S_1 \sim S_{16}$, indicating the ANDs of the divided clock CK2 and each of the sixteen first delay clocks $12_1 \sim 12_{16}$. As shown in FIG. 3, since the sixteen first delay clocks $12_1 \sim 12_{16}$ are obtained by sequentially delaying for the first delay time t, the corresponding shrunk clocks $S_1 \sim S_{16}$ are also sequentially shrunk by the first delay time t. As a result, once a shrunk clock $S_x$ (say $S_8$) becomes all 0's, the first delay clock $12_x$ (say $12_8$) corresponding to the shrunk clock $S_x$ is exactly the inverse of the divided clock CK2. That is to say, the delay time of the first delay clock $12_x$, which is 8t, is exactly the period of the input clock CK (or a half of the period of the divided clock CK2).

The sixteen latches LA1~LA16 latch the sixteen shrunk clocks $S_1 \sim S_{16}$, respectively, to obtain sixteen latch signals $L_1 \sim L_{16}$. In this case, the sixteen latches LA1~LA16 are triggered by falling edges of the divided clock CK2 to latch the sixteen shrunk clocks $S_1 \sim S_{16}$. Therefore, once the shrunk clock $S_x$ (say $S_8$) according to the first delay clock $12_x$ becomes all 0's, the latch signals $L_1 \sim L_{x-1}$ (say $L_1 \sim L_7$) corresponding to the previous shrunk clocks $S_1 \sim S_{x-1}$ (say $S_1 \sim S_7$) will become all 1's, and the latch signals $L_x \sim L_{16}$ (say $L_8 \sim L_{16}$) corresponding to the shrunk clock $S_x$ (say $S_9$) and the preceding shrunk clocks $S_{x+1} \sim S_{16}$ (say $S_9 \sim S_{16}$) will become all 0's.

Thereafter, the fifteen XOR gates X1~X15 respectively XOR adjacent latch signals LA1~LA16 to obtain fifteen select signals $16_1 \sim 16_{15}$. From above, among the fifteen select signals $16_1 \sim 16_{15}$, only the select signal $16_x$ (say $16_8$) obtained by XORing the latch signal $L_x$ and the latch signal $L_{x+1}$ is all 1's, and all the other latch signals $16_1 \sim 16_{x-1}$ (say $16_1 \sim 16_7$) and $16_{x+1} \sim 16_{15}$ (say $16_9 \sim 16_{16}$) are all 0's.

Then, the sixteen switches T1~T16 are controlled by the fifteen select signals $16_1 \sim 16_{15}$ from the fifteen XOR gates X1~X15 and the latch signal $L_{16}$ from the latch LA16, respectively, to select the second delay clock $14_x$ according to the first delay clock $12_x$ as the selected delay clock CK2'. In this case, the delay time of the selected delay clock CK2' is just a half of the delay time of the first delay clock $12_x$ or a half of the period of the input clock CK.

The logic circuit 18 XORs the divided clock CK2 and the selected delay clock CK2', the delay time of which is half the period of the input clock CK, to obtain a clock CK' having a 1/2 duty cycle.

Summing up the above, the device and method for generating a variable duty cycle clock of the present invention uses match delay lines to adjust the duty cycle, and uses digital circuits to lower the power dissipation. In addition, the device and method to generate a variable duty cycle clock of the present invention is portable and usable in different processes, and can improve response characteristics by reducing the oscillation time and the recovery time to less than one clock.

It should be understood that the present invention is not limited to the preferred embodiment as disclosed above. Variations and modifications can be made by those who are skillful in the art without departing from the spirit and scope of the present invention as defined in the appended claims. Thus, this invention is not to be limited to the disclosed embodiment except as required by the appended claims.

What is claimed is:

1. A device for generating a variable duty cycle clock, comprising:
    a frequency divider for dividing an input clock to obtain a divided clock;
    a plurality of first delay elements connected in series, for sequentially delaying the divided clock for a first delay time to obtain a plurality of first delay clocks;
    a plurality of second delay elements connected in series and corresponding to the first delay elements, for sequentially delaying the divided clock for a second delay time to obtain a plurality of second delay clocks, wherein the second delay time is in a variable proportion to the first delay time;
    a selector for comparing the divided clock and the first delay clocks to obtain a plurality of state signals for selecting a first selected clock corresponding to a period of the input clock from the first delay clocks, and a second selected clock corresponding to the first selected clock from the second delay clocks; and
    a logic circuit for XORing the divided clock and the second selected clock to obtain the variable duty cycle clock.

2. The device for generating the variable duty cycle clock as claimed in claim 1, wherein the frequency divider is constructed with a D-type flip flop having a clock terminal (CLK) receiving the input clock, an inverse output terminal (Qn), a data terminal (D) connected to the inverse output terminal (Qn), and an output terminal (Q) outputting the divided clock.

3. The device for generating the variable duty cycle clock as claimed in claim 1, wherein the first delay elements are constructed with a delay line having a plurality of first line segments connected in series, and each of the first line segments has the first delay time.

4. The device for generating the variable duty cycle clock as claimed in claim 1, wherein the second delay elements are constructed with a delay line having a plurality of second line segments connected in series, and each of the second line segments has the second delay time.

5. The device for generating a variable duty cycle clock as claimed in claim 1, further comprising:
    a plurality of AND gates for ANDing the divided clock and the first delay clocks to obtain a plurality of shrunk clocks;
    a plurality of latches for latching the shrunk clocks to obtain a plurality of latch signals;
    a plurality of XOR gates for XORing adjacent latch signals to obtain state signals corresponding to the second delay elements; and
    a plurality of switches for selecting the second selected clock according to the state signals.

6. The device for generating the variable duty cycle clock as claimed in claim 5, wherein each of the switches is constructed with a transmission gate having a control terminal connected to one of the state signals.

7. A method for generating a variable duty cycle clock, comprising:
    providing an input clock;
    frequency dividing the input clock to obtain a divided clock;
    sequentially delaying the divided clock for a first delay time to obtain a plurality of first delay clocks;
    sequentially delaying the divided clock for a second delay time to obtain a plurality of second delay clocks corresponding to the first delay clocks, wherein the second delay time is in a variable proportion to the first delay time;
    comparing the divided clock and the first delay clocks to obtain a plurality of state signals for selecting a first selected clock corresponding to a period of the input clock from the first delay clocks, and a second selected clock corresponding to the first selected clock from the second delay clocks; and
    XORing the divided clock and the second selected clock to generate the variable duty cycle clock.

8. The method for generating the variable duty cycle clock as claimed in claim 7, wherein the divided clock is generated by a D-type flip flop having a clock terminal (CLK) receiving the input clock, an inverse output terminal (Qn), a data terminal (D) connected to the inverse output terminal (Qn), and an output terminal (Q) outputting the divided clock.

9. The method for generating the variable duty cycle clock as claimed in claim 7, wherein the first delay clocks are generated by a delay line having a plurality of first line segments connected in series, and each of the first line segments has the first delay time.

10. The method for generating the variable duty cycle clock as claimed in claim 7, wherein the second delay clocks are generated by a delay line having a plurality of second line segments connected in series, and each of the second line segments has the second delay time.

11. The method for generating a variable duty cycle clock as claimed in claim 7, further comprising the steps of:

ANDing the divided clock and the first delay clocks to obtain a plurality of shrunk clocks;

latching the shrunk clocks to obtain a plurality of latch signals; and

XORing adjacent latch signals to obtain the state signals.

12. The method for generating the variable duty cycle clock as claimed in claim 7, wherein the second selected clock is selected by a plurality of switches corresponding to the second delay clocks, and each of the switches has a control terminal connected to one of the state signals.

* * * * *